(12) United States Patent
He et al.

(10) Patent No.: US 12,112,787 B2
(45) Date of Patent: Oct. 8, 2024

(54) APPARATUSES AND METHODS FOR ACCESS BASED TARGETED REFRESH OPERATIONS

(71) Applicant: MICRON TECHNOLOGY, INC., Boise, ID (US)

(72) Inventors: Yuan He, Boise, ID (US); Takamasa Suzuki, Tokyo (JP)

(73) Assignee: Micron Technology, Inc., Boise, ID (US)

(*) Notice: Subject to any disclaimer, the term of this patent is extended or adjusted under 35 U.S.C. 154(b) by 93 days.

(21) Appl. No.: 17/731,645

(22) Filed: Apr. 28, 2022

(65) Prior Publication Data

US 2023/0352076 A1  Nov. 2, 2023

(51) Int. Cl.
*G11C 11/406* (2006.01)
*G11C 11/408* (2006.01)

(52) U.S. Cl.
CPC ............ *G11C 11/40622* (2013.01); *G11C 11/40615* (2013.01); *G11C 11/4085* (2013.01)

(58) Field of Classification Search
CPC .............. G11C 11/40622; G11C 11/406
USPC ......................................................... 365/222
See application file for complete search history.

(56) References Cited

U.S. PATENT DOCUMENTS

| | | | |
|---|---|---|---|
| 5,225,839 A | 7/1993 | Okurowski et al. | |
| 5,299,159 A | 3/1994 | Balistreri et al. | |
| 5,654,929 A | 8/1997 | Mote, Jr. | |
| 5,699,297 A | 12/1997 | Yamazaki et al. | |
| 5,867,442 A | 2/1999 | Kim et al. | |
| 5,933,377 A | 8/1999 | Hidaka | |
| 5,943,283 A | 8/1999 | Wong et al. | |
| 5,956,288 A | 9/1999 | Bermingham et al. | |
| 5,959,923 A | 9/1999 | Matteson et al. | |
| 5,970,507 A | 10/1999 | Kato et al. | |
| 5,999,471 A | 12/1999 | Choi | |
| 5,999,473 A | 12/1999 | Harrington et al. | |
| 6,002,629 A | 12/1999 | Kim et al. | |
| 6,011,734 A | 1/2000 | Pappert | |
| 6,061,290 A | 5/2000 | Shirley | |
| 6,064,621 A | 5/2000 | Tanizaki et al. | |
| 6,212,118 B1 | 4/2001 | Fujita | |

(Continued)

FOREIGN PATENT DOCUMENTS

| BE | 825677 A | 8/1975 |
|---|---|---|
| CN | 1841551 A | 10/2006 |

(Continued)

OTHER PUBLICATIONS

Kyungbae Park et al. "Experiments an Droot Cause Analysis for Active-Precharge Hammering Fault in DDR3 SDRAM Under 3XNM Technology"; Microelectronics Reliability:An Internet.Journaland World Abstracting Service; vol. 57, Dec. 23, 2015;pp. 39-46.*

(Continued)

*Primary Examiner* — Muna A Techane
(74) *Attorney, Agent, or Firm* — Dorsey & Whitney LLP

(57) ABSTRACT

Apparatuses, systems, and methods for access based targeted refresh operations. A memory bank has a first sub-bank and a second sub-bank. A refresh control circuit detects an aggressor in one of the sub-banks. Responsive to an access in the other sub-bank, the refresh control circuit performs a targeted refresh operation based on the sub-bank based on the aggressor address.

14 Claims, 7 Drawing Sheets

(56) References Cited

U.S. PATENT DOCUMENTS

| | | |
|---|---|---|
| 6,306,721 B1 | 10/2001 | Teo et al. |
| 6,310,806 B1 | 10/2001 | Higashi et al. |
| 6,310,814 B1 | 10/2001 | Hampel et al. |
| 6,363,024 B1 | 3/2002 | Fibranz |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,490,216 B1 | 12/2002 | Chen et al. |
| 6,515,928 B2 | 2/2003 | Sato et al. |
| 6,535,950 B1 | 3/2003 | Funyu et al. |
| 6,535,980 B1 | 3/2003 | Kumar et al. |
| 6,563,757 B2 | 5/2003 | Agata |
| 6,567,340 B1 | 5/2003 | Nataraj et al. |
| 6,950,364 B2 | 9/2005 | Kim |
| 7,002,868 B2 | 2/2006 | Takahashi |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,444,577 B2 | 10/2008 | Best et al. |
| 7,551,502 B2 | 6/2009 | Dono et al. |
| 7,565,479 B2 | 7/2009 | Best et al. |
| 7,692,993 B2 | 4/2010 | Iida et al. |
| 7,830,742 B2 | 11/2010 | Han |
| 8,174,921 B2 | 5/2012 | Kim et al. |
| 8,400,805 B2 | 3/2013 | Yoko |
| 8,526,260 B2 | 9/2013 | Pyeon |
| 8,572,423 B1 | 10/2013 | Isachar et al. |
| 8,625,360 B2 | 1/2014 | Iwamoto et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,076,499 B2 | 7/2015 | Schoenborn et al. |
| 9,076,548 B1 | 7/2015 | Park et al. |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,236,110 B2 | 1/2016 | Bains et al. |
| 9,251,885 B2 | 2/2016 | Greenfield et al. |
| 9,286,964 B2 | 3/2016 | Halbert et al. |
| 9,299,400 B2 | 3/2016 | Bains et al. |
| 9,311,984 B1 | 4/2016 | Hong et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,396,786 B2 | 7/2016 | Yoon et al. |
| 9,406,358 B1 | 8/2016 | Lee |
| 9,412,432 B2 | 8/2016 | Narui et al. |
| 9,418,723 B2 | 8/2016 | Chishti et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,570,201 B2 | 2/2017 | Morgan et al. |
| 9,646,672 B1 | 5/2017 | Kim et al. |
| 9,653,139 B1 | 5/2017 | Park |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,421 B1 | 8/2017 | Hedden |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,812,185 B2 | 11/2017 | Fisch et al. |
| 9,818,469 B1 | 11/2017 | Kim et al. |
| 9,831,003 B2 | 11/2017 | Sohn et al. |
| 9,865,326 B2 | 1/2018 | Bains et al. |
| 9,865,328 B1 | 1/2018 | Desimone et al. |
| 9,892,779 B2 | 2/2018 | Kang et al. |
| 9,922,694 B2 | 3/2018 | Akamatsu |
| 9,934,143 B2 | 4/2018 | Bains et al. |
| 9,953,696 B2 | 4/2018 | Kim |
| 9,972,377 B2 | 5/2018 | Oh et al. |
| 9,978,430 B2 | 5/2018 | Seo et al. |
| 10,020,045 B2 | 7/2018 | Riho |
| 10,020,046 B1 | 7/2018 | Uemura |
| 10,032,501 B2 | 7/2018 | Ito et al. |
| 10,049,716 B2 | 8/2018 | Proebsting |
| 10,083,737 B2 | 9/2018 | Bains et al. |
| 10,090,038 B2 | 10/2018 | Shin |
| 10,134,461 B2 | 11/2018 | Bell et al. |
| 10,141,042 B1 | 11/2018 | Richter |
| 10,147,472 B2 | 12/2018 | Jones et al. |
| 10,153,031 B2 | 12/2018 | Akamatsu |
| 10,170,174 B1 | 1/2019 | Ito et al. |
| 10,192,608 B2 | 1/2019 | Morgan |
| 10,210,925 B2 | 2/2019 | Bains et al. |
| 10,297,305 B1 | 5/2019 | Moon et al. |
| 10,297,307 B1 | 5/2019 | Raad et al. |
| 10,339,994 B2 | 7/2019 | Ito et al. |
| 10,381,327 B2 | 8/2019 | Ramachandra et al. |
| 10,446,256 B2 | 10/2019 | Ong et al. |
| 10,468,076 B1 | 11/2019 | He et al. |
| 10,490,250 B1 | 11/2019 | Ito et al. |
| 10,490,251 B2 | 11/2019 | Wolff |
| 10,504,577 B1 | 12/2019 | Alzheimer |
| 10,510,396 B1 | 12/2019 | Notani et al. |
| 10,572,377 B1 | 2/2020 | Zhang et al. |
| 10,573,370 B2 | 2/2020 | Ito et al. |
| 10,607,679 B2 | 3/2020 | Nakaoka |
| 10,685,696 B2 | 6/2020 | Brown et al. |
| 10,699,796 B2 | 6/2020 | Benedict et al. |
| 10,790,005 B1 | 9/2020 | He et al. |
| 10,825,505 B2 | 11/2020 | Rehmeyer |
| 10,832,792 B1 | 11/2020 | Penney et al. |
| 10,930,335 B2 | 2/2021 | Bell et al. |
| 10,943,636 B1 | 3/2021 | Wu et al. |
| 10,950,289 B2 | 3/2021 | Ito et al. |
| 10,957,377 B2 | 3/2021 | Noguchi |
| 10,964,378 B2 | 3/2021 | Ayyapureddi et al. |
| 10,978,132 B2 | 4/2021 | Rehmeyer et al. |
| 11,017,833 B2 | 5/2021 | Wu et al. |
| 11,069,393 B2 | 7/2021 | Cowles et al. |
| 11,081,160 B2 | 8/2021 | Ito et al. |
| 11,222,683 B2 * | 1/2022 | Rehmeyer ............ G11C 29/702 |
| 11,222,686 B1 | 1/2022 | Noguchi |
| 11,227,649 B2 | 1/2022 | Meier et al. |
| 11,264,079 B1 | 3/2022 | Roberts |
| 11,302,374 B2 | 4/2022 | Jenkinson et al. |
| 11,302,377 B2 | 4/2022 | Li et al. |
| 11,309,010 B2 | 4/2022 | Ayyapureddi |
| 11,309,012 B2 | 4/2022 | Meier et al. |
| 11,315,619 B2 | 4/2022 | Wolff |
| 11,315,620 B2 | 4/2022 | Ishikawa et al. |
| 11,320,377 B2 | 5/2022 | Chen et al. |
| 11,348,631 B2 | 5/2022 | Wu et al. |
| 11,380,382 B2 | 7/2022 | Zhang et al. |
| 11,386,946 B2 * | 7/2022 | Ayyapureddi .... G11C 11/40622 |
| 11,417,383 B2 | 8/2022 | Jenkinson et al. |
| 11,532,346 B2 | 12/2022 | Brown et al. |
| 11,557,331 B2 | 1/2023 | Mitsubori et al. |
| 11,610,622 B2 | 3/2023 | Rehmeyer et al. |
| 11,615,831 B2 | 3/2023 | Yamamoto |
| 11,626,152 B2 | 4/2023 | Wu et al. |
| 11,688,452 B2 | 6/2023 | Nale et al. |

(56) References Cited

U.S. PATENT DOCUMENTS

| | | |
|---|---|---|
| 11,715,512 B2 | 8/2023 | Li et al. |
| 11,749,331 B2 | 9/2023 | Wu et al. |
| 11,798,610 B2 | 10/2023 | Cowles et al. |
| 11,810,612 B2 | 11/2023 | Roberts |
| 11,935,576 B2 | 3/2024 | Ishikawa et al. |
| 11,955,158 B2 | 4/2024 | Brown et al. |
| 2001/0008498 A1 | 7/2001 | Ooishi |
| 2002/0026613 A1 | 2/2002 | Niiro |
| 2002/0181301 A1 | 12/2002 | Takahashi et al. |
| 2002/0191467 A1 | 12/2002 | Matsumoto et al. |
| 2003/0026161 A1 | 2/2003 | Yamaguchi et al. |
| 2003/0063512 A1 | 4/2003 | Takahashi et al. |
| 2003/0067825 A1 | 4/2003 | Shimano et al. |
| 2003/0081483 A1 | 5/2003 | De et al. |
| 2003/0123301 A1 | 7/2003 | Jang et al. |
| 2003/0161208 A1 | 8/2003 | Nakashima et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0024955 A1 | 2/2004 | Patel |
| 2004/0114446 A1 | 6/2004 | Takahashi et al. |
| 2004/0130959 A1 | 7/2004 | Kawaguchi |
| 2004/0184323 A1 | 9/2004 | Mori et al. |
| 2004/0218431 A1 | 11/2004 | Chung et al. |
| 2005/0002268 A1 | 1/2005 | Otsuka et al. |
| 2005/0041502 A1 | 2/2005 | Perner |
| 2005/0105362 A1 | 5/2005 | Choi et al. |
| 2005/0108460 A1 | 5/2005 | David |
| 2005/0213408 A1 | 9/2005 | Shieh |
| 2005/0243627 A1 | 11/2005 | Lee et al. |
| 2005/0249009 A1 | 11/2005 | Shieh |
| 2005/0265104 A1 | 12/2005 | Remaklus et al. |
| 2006/0018174 A1 | 1/2006 | Park et al. |
| 2006/0083099 A1 | 4/2006 | Bae et al. |
| 2006/0087903 A1 | 4/2006 | Riho et al. |
| 2006/0104139 A1 | 5/2006 | Hur et al. |
| 2006/0176744 A1 | 8/2006 | Stave |
| 2006/0198220 A1 | 9/2006 | Yoon et al. |
| 2006/0215474 A1 | 9/2006 | Hokenmaier |
| 2006/0233012 A1 | 10/2006 | Sekiguchi et al. |
| 2006/0262616 A1 | 11/2006 | Chen |
| 2006/0262617 A1 | 11/2006 | Lee |
| 2006/0268643 A1 | 11/2006 | Schreck et al. |
| 2007/0002651 A1 | 1/2007 | Lee |
| 2007/0008799 A1 | 1/2007 | Dono et al. |
| 2007/0014175 A1 | 1/2007 | Min et al. |
| 2007/0028068 A1 | 2/2007 | Golding et al. |
| 2007/0030746 A1 | 2/2007 | Best et al. |
| 2007/0033338 A1 | 2/2007 | Tsern |
| 2007/0033339 A1 | 2/2007 | Best et al. |
| 2007/0106838 A1 | 5/2007 | Choi |
| 2007/0147154 A1 | 6/2007 | Lee |
| 2007/0165042 A1 | 7/2007 | Yagi |
| 2007/0171750 A1 | 7/2007 | Oh |
| 2007/0237016 A1 | 10/2007 | Miyamoto et al. |
| 2007/0263442 A1 | 11/2007 | Cornwell et al. |
| 2007/0297252 A1 | 12/2007 | Singh |
| 2008/0028137 A1 | 1/2008 | Schakel et al. |
| 2008/0028260 A1 | 1/2008 | Oyagi et al. |
| 2008/0031068 A1 | 2/2008 | Yoo et al. |
| 2008/0126893 A1 | 5/2008 | Harrand et al. |
| 2008/0130394 A1 | 6/2008 | Dono et al. |
| 2008/0181048 A1 | 7/2008 | Han |
| 2008/0212386 A1 | 9/2008 | Riho |
| 2008/0224742 A1 | 9/2008 | Pomichter |
| 2008/0253212 A1 | 10/2008 | Iida et al. |
| 2008/0253213 A1 | 10/2008 | Sato et al. |
| 2008/0266990 A1 | 10/2008 | Loeffler |
| 2008/0270683 A1 | 10/2008 | Barth et al. |
| 2008/0306723 A1 | 12/2008 | De et al. |
| 2008/0316845 A1 | 12/2008 | Wang et al. |
| 2009/0021999 A1 | 1/2009 | Tanimura et al. |
| 2009/0052264 A1 | 2/2009 | Hong et al. |
| 2009/0059641 A1 | 3/2009 | Jeddeloh |
| 2009/0073760 A1 | 3/2009 | Betser et al. |
| 2009/0147606 A1 | 6/2009 | Daniel |
| 2009/0161468 A1 | 6/2009 | Fujioka |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0228739 A1 | 9/2009 | Cohen et al. |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0061153 A1 | 3/2010 | Yen et al. |
| 2010/0074042 A1 | 3/2010 | Fukuda et al. |
| 2010/0097870 A1 | 4/2010 | Kim et al. |
| 2010/0110809 A1 | 5/2010 | Kobayashi et al. |
| 2010/0110810 A1 | 5/2010 | Kobayashi |
| 2010/0124138 A1 | 5/2010 | Lee et al. |
| 2010/0128547 A1 | 5/2010 | Kagami |
| 2010/0131812 A1 | 5/2010 | Mohammad |
| 2010/0141309 A1 | 6/2010 | Lee |
| 2010/0157693 A1 | 6/2010 | Iwai et al. |
| 2010/0182862 A1 | 7/2010 | Teramoto |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0055495 A1 | 3/2011 | Remaklus, Jr. et al. |
| 2011/0069572 A1 | 3/2011 | Lee et al. |
| 2011/0122987 A1 | 5/2011 | Neyer |
| 2011/0134715 A1 | 6/2011 | Norman |
| 2011/0216614 A1 | 9/2011 | Hosoe |
| 2011/0225355 A1 | 9/2011 | Kajigaya |
| 2011/0299352 A1 | 12/2011 | Fujishiro et al. |
| 2011/0310648 A1 | 12/2011 | Iwamoto et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0155173 A1 | 6/2012 | Lee et al. |
| 2012/0155206 A1 | 6/2012 | Kodama et al. |
| 2012/0213021 A1 | 8/2012 | Riho et al. |
| 2012/0254472 A1 | 10/2012 | Ware et al. |
| 2012/0287727 A1 | 11/2012 | Wang |
| 2012/0307582 A1 | 12/2012 | Marumoto et al. |
| 2012/0327734 A1 | 12/2012 | Sato |
| 2013/0003467 A1 | 1/2013 | Klein |
| 2013/0003477 A1 | 1/2013 | Park et al. |
| 2013/0028034 A1 | 1/2013 | Fujisawa |
| 2013/0051157 A1 | 2/2013 | Park |
| 2013/0051171 A1 | 2/2013 | Porter et al. |
| 2013/0077423 A1 | 3/2013 | Lee |
| 2013/0173971 A1 | 7/2013 | Zimmerman |
| 2013/0254475 A1 | 9/2013 | Perego et al. |
| 2013/0279284 A1 | 10/2013 | Jeong |
| 2013/0304982 A1 | 11/2013 | Jung et al. |
| 2014/0006700 A1 | 1/2014 | Schaefer et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0016422 A1 | 1/2014 | Kim et al. |
| 2014/0022858 A1 | 1/2014 | Chen et al. |
| 2014/0043888 A1 | 2/2014 | Chen et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0089576 A1 | 3/2014 | Bains et al. |
| 2014/0089758 A1 | 3/2014 | Kwok et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0143473 A1 | 5/2014 | Kim et al. |
| 2014/0156923 A1 | 6/2014 | Bains et al. |
| 2014/0169114 A1 | 6/2014 | Oh |
| 2014/0177370 A1 | 6/2014 | Halbert et al. |
| 2014/0181453 A1 | 6/2014 | Jayasena et al. |
| 2014/0185403 A1 | 7/2014 | Lai |
| 2014/0189228 A1 | 7/2014 | Greenfield et al. |
| 2014/0219042 A1 | 8/2014 | Yu et al. |
| 2014/0219043 A1 | 8/2014 | Jones et al. |

(56) References Cited

U.S. PATENT DOCUMENTS

| | | |
|---|---|---|
| 2014/0237307 A1 | 8/2014 | Kobla et al. |
| 2014/0241099 A1 | 8/2014 | Seo et al. |
| 2014/0254298 A1 | 9/2014 | Dally |
| 2014/0281206 A1 | 9/2014 | Crawford et al. |
| 2014/0281207 A1 | 9/2014 | Mandava et al. |
| 2014/0293725 A1 | 10/2014 | Best et al. |
| 2014/0321226 A1 | 10/2014 | Pyeon |
| 2015/0016203 A1 | 1/2015 | Sriramagiri et al. |
| 2015/0036445 A1 | 2/2015 | Yoshida et al. |
| 2015/0049566 A1 | 2/2015 | Lee et al. |
| 2015/0049567 A1 | 2/2015 | Chi |
| 2015/0055420 A1 | 2/2015 | Bell et al. |
| 2015/0078112 A1 | 3/2015 | Huang |
| 2015/0085564 A1 | 3/2015 | Yoon et al. |
| 2015/0089326 A1 | 3/2015 | Joo et al. |
| 2015/0092508 A1 | 4/2015 | Bains |
| 2015/0109871 A1 | 4/2015 | Bains et al. |
| 2015/0120999 A1 | 4/2015 | Kim et al. |
| 2015/0134897 A1 | 5/2015 | Sriramagiri et al. |
| 2015/0155025 A1 | 6/2015 | Lee et al. |
| 2015/0162064 A1 | 6/2015 | Oh et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0243339 A1 | 8/2015 | Bell et al. |
| 2015/0255140 A1 | 9/2015 | Song |
| 2015/0279441 A1 | 10/2015 | Greenberg et al. |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2015/0380073 A1 | 12/2015 | Joo et al. |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0070483 A1 | 3/2016 | Yoon et al. |
| 2016/0078846 A1 | 3/2016 | Liu et al. |
| 2016/0078911 A1 | 3/2016 | Fujiwara et al. |
| 2016/0086649 A1 | 3/2016 | Hong et al. |
| 2016/0093402 A1 | 3/2016 | Kitagawa et al. |
| 2016/0125931 A1 | 5/2016 | Doo et al. |
| 2016/0133314 A1 | 5/2016 | Hwang et al. |
| 2016/0155491 A1 | 6/2016 | Roberts et al. |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0224262 A1 | 8/2016 | Mandava et al. |
| 2016/0225433 A1 | 8/2016 | Bains et al. |
| 2016/0336060 A1 | 11/2016 | Shin |
| 2016/0343423 A1 | 11/2016 | Shido |
| 2017/0011792 A1 | 1/2017 | Oh et al. |
| 2017/0052722 A1 | 2/2017 | Ware et al. |
| 2017/0062038 A1 | 3/2017 | Doo et al. |
| 2017/0076779 A1 | 3/2017 | Bains et al. |
| 2017/0092350 A1 | 3/2017 | Halbert et al. |
| 2017/0110177 A1 | 4/2017 | Lee et al. |
| 2017/0111792 A1 | 4/2017 | Correia Fernandes et al. |
| 2017/0117030 A1 | 4/2017 | Fisch et al. |
| 2017/0133085 A1 | 5/2017 | Kim et al. |
| 2017/0133108 A1 | 5/2017 | Lee et al. |
| 2017/0140807 A1 | 5/2017 | Sun et al. |
| 2017/0140810 A1 | 5/2017 | Choi et al. |
| 2017/0140811 A1 | 5/2017 | Joo |
| 2017/0146598 A1 | 5/2017 | Kim et al. |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0269861 A1 | 9/2017 | Lu et al. |
| 2017/0287547 A1 | 10/2017 | Ito et al. |
| 2017/0323675 A1 | 11/2017 | Jones et al. |
| 2017/0345482 A1 | 11/2017 | Balakrishnan |
| 2017/0352404 A1 | 12/2017 | Lee et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0025773 A1 | 1/2018 | Bains et al. |
| 2018/0033479 A1 | 2/2018 | Lea et al. |
| 2018/0047110 A1 | 2/2018 | Blackman et al. |
| 2018/0061476 A1 | 3/2018 | Kim |
| 2018/0061483 A1 | 3/2018 | Morgan |
| 2018/0061485 A1 | 3/2018 | Joo |
| 2018/0075927 A1 | 3/2018 | Jeong et al. |
| 2018/0082736 A1 | 3/2018 | Jung |
| 2018/0082737 A1 | 3/2018 | Lee |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0108401 A1 | 4/2018 | Choi et al. |
| 2018/0114561 A1 | 4/2018 | Fisch et al. |
| 2018/0114565 A1 | 4/2018 | Lee |
| 2018/0122454 A1 | 5/2018 | Lee et al. |
| 2018/0130506 A1 | 5/2018 | Kang et al. |
| 2018/0137005 A1 | 5/2018 | Wu et al. |
| 2018/0158504 A1 | 6/2018 | Akamatsu |
| 2018/0158507 A1 | 6/2018 | Bang |
| 2018/0182445 A1 | 6/2018 | Lee et al. |
| 2018/0190340 A1 | 7/2018 | Kim et al. |
| 2018/0218767 A1 | 8/2018 | Wolff |
| 2018/0226119 A1 | 8/2018 | Kim et al. |
| 2018/0233197 A1 | 8/2018 | Laurent |
| 2018/0240511 A1 | 8/2018 | Yoshida et al. |
| 2018/0247876 A1 | 8/2018 | Kim et al. |
| 2018/0254078 A1 | 9/2018 | We et al. |
| 2018/0261268 A1 | 9/2018 | Hyun et al. |
| 2018/0276150 A1 | 9/2018 | Eckert et al. |
| 2018/0285007 A1 | 10/2018 | Franklin et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0065087 A1 | 2/2019 | Li et al. |
| 2019/0066759 A1 | 2/2019 | Nale |
| 2019/0066766 A1 | 2/2019 | Lee |
| 2019/0088315 A1 | 3/2019 | Saenz et al. |
| 2019/0088316 A1 | 3/2019 | Inuzuka et al. |
| 2019/0103147 A1 | 4/2019 | Jones et al. |
| 2019/0115069 A1 | 4/2019 | Lai |
| 2019/0122723 A1 | 4/2019 | Ito et al. |
| 2019/0129651 A1 | 5/2019 | Wuu et al. |
| 2019/0130960 A1 | 5/2019 | Kim |
| 2019/0130961 A1 | 5/2019 | Bell et al. |
| 2019/0147964 A1 | 5/2019 | Yun et al. |
| 2019/0161341 A1 | 5/2019 | Howe |
| 2019/0190341 A1 | 6/2019 | Beisele et al. |
| 2019/0196730 A1 | 6/2019 | Imran |
| 2019/0198078 A1 | 6/2019 | Hoang et al. |
| 2019/0198099 A1 | 6/2019 | Mirichigni et al. |
| 2019/0205253 A1 | 7/2019 | Roberts |
| 2019/0228810 A1 | 7/2019 | Jones et al. |
| 2019/0228815 A1 | 7/2019 | Morohashi et al. |
| 2019/0237132 A1 | 8/2019 | Morohashi |
| 2019/0252020 A1 | 8/2019 | Rios et al. |
| 2019/0267077 A1 | 8/2019 | Ito et al. |
| 2019/0279706 A1 | 9/2019 | Kim |
| 2019/0294348 A1 | 9/2019 | Ware et al. |
| 2019/0333573 A1 | 10/2019 | Shin et al. |
| 2019/0347019 A1 | 11/2019 | Shin et al. |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0362774 A1 | 11/2019 | Kuramori et al. |
| 2019/0385661 A1 | 12/2019 | Koo et al. |
| 2019/0385667 A1 | 12/2019 | Morohashi et al. |
| 2019/0385668 A1 | 12/2019 | Fujioka et al. |

(56) References Cited

U.S. PATENT DOCUMENTS

| | | |
|---|---|---|
| 2019/0385670 A1 | 12/2019 | Notani et al. |
| 2019/0386557 A1 | 12/2019 | Wang et al. |
| 2019/0391760 A1 | 12/2019 | Miura et al. |
| 2019/0392886 A1 | 12/2019 | Cox et al. |
| 2020/0005857 A1 | 1/2020 | Ito et al. |
| 2020/0051616 A1 | 2/2020 | Cho |
| 2020/0075086 A1 | 3/2020 | Hou et al. |
| 2020/0082873 A1 | 3/2020 | Wolff |
| 2020/0126611 A1 | 4/2020 | Riho et al. |
| 2020/0135263 A1 | 4/2020 | Brown et al. |
| 2020/0143871 A1 | 5/2020 | Kim et al. |
| 2020/0176050 A1 | 6/2020 | Ito et al. |
| 2020/0185026 A1 | 6/2020 | Yun et al. |
| 2020/0194050 A1 | 6/2020 | Akamatsu |
| 2020/0194056 A1 | 6/2020 | Sakurai et al. |
| 2020/0202921 A1 | 6/2020 | Morohashi et al. |
| 2020/0210278 A1 | 7/2020 | Rooney et al. |
| 2020/0211632 A1 | 7/2020 | Noguchi |
| 2020/0211633 A1 | 7/2020 | Okuma |
| 2020/0211634 A1 | 7/2020 | Ishikawa et al. |
| 2020/0219555 A1 | 7/2020 | Rehmeyer |
| 2020/0219556 A1 | 7/2020 | Ishikawa et al. |
| 2020/0265888 A1 | 8/2020 | Ito et al. |
| 2020/0273517 A1 | 8/2020 | Yamamoto |
| 2020/0273518 A1 | 8/2020 | Raad et al. |
| 2020/0279599 A1 | 9/2020 | Ware et al. |
| 2020/0294569 A1 | 9/2020 | Wu et al. |
| 2020/0294576 A1 | 9/2020 | Brown et al. |
| 2020/0321049 A1 | 10/2020 | Meier et al. |
| 2020/0381040 A1 | 12/2020 | Penney et al. |
| 2020/0388324 A1 | 12/2020 | Rehmeyer et al. |
| 2020/0388325 A1 | 12/2020 | Cowles et al. |
| 2020/0395063 A1 | 12/2020 | Rehmeyer |
| 2021/0057021 A1 | 2/2021 | Wu et al. |
| 2021/0057022 A1 | 2/2021 | Jenkinson et al. |
| 2021/0109577 A1* | 4/2021 | Mandava ............ G06F 13/1668 |
| 2021/0118491 A1 | 4/2021 | Li et al. |
| 2021/0166752 A1 | 6/2021 | Noguchi |
| 2021/0183433 A1 | 6/2021 | Jenkinson et al. |
| 2021/0183435 A1 | 6/2021 | Meier et al. |
| 2021/0225431 A1 | 7/2021 | Rehmeyer et al. |
| 2021/0304813 A1 | 9/2021 | Cowles et al. |
| 2021/0335411 A1 | 10/2021 | Wu et al. |
| 2021/0350844 A1 | 11/2021 | Morohashi et al. |
| 2021/0406170 A1 | 12/2021 | Jung et al. |
| 2022/0059153 A1 | 2/2022 | Zhang et al. |
| 2022/0059158 A1 | 2/2022 | Wu et al. |
| 2022/0091784 A1* | 3/2022 | Brandl ............... G11C 11/40611 |
| 2022/0093165 A1 | 3/2022 | Mitsubori et al. |
| 2022/0165328 A1 | 5/2022 | Ishikawa et al. |
| 2022/0189537 A1* | 6/2022 | Kim ..................... G06F 3/0644 |
| 2022/0189539 A1 | 6/2022 | Li et al. |
| 2022/0199144 A1 | 6/2022 | Roberts |
| 2022/0270670 A1 | 8/2022 | Wu et al. |
| 2023/0105151 A1 | 4/2023 | Brown et al. |
| 2023/0352076 A1 | 11/2023 | He et al. |
| 2024/0062798 A1 | 2/2024 | Cowles et al. |
| 2024/0071460 A1 | 2/2024 | Noguchi |

FOREIGN PATENT DOCUMENTS

| | | |
|---|---|---|
| CN | 1879173 A | 12/2006 |
| CN | 101026003 A | 8/2007 |
| CN | 101038785 A | 9/2007 |
| CN | 101047025 A | 10/2007 |
| CN | 101067972 A | 11/2007 |
| CN | 101211653 A | 7/2008 |
| CN | 101243450 A | 8/2008 |
| CN | 102301423 A | 12/2011 |
| CN | 102663155 A | 9/2012 |
| CN | 102931187 A | 2/2013 |
| CN | 104350546 A | 2/2015 |
| CN | 104733035 A | 6/2015 |
| CN | 104737234 A | 6/2015 |
| CN | 104781885 A | 7/2015 |
| CN | 104981874 A | 10/2015 |
| CN | 105378847 A | 3/2016 |
| CN | 105529047 A | 4/2016 |
| CN | 106710621 A | 5/2017 |
| CN | 107025927 A | 8/2017 |
| CN | 107871516 A | 4/2018 |
| CN | 107919150 A | 4/2018 |
| CN | 108154895 A | 6/2018 |
| CN | 108242248 A | 7/2018 |
| CN | 109949844 A | 6/2019 |
| CN | 110520929 A | 11/2019 |
| CN | 114121076 A | 3/2022 |
| JP | S6282887 A | 4/1987 |
| JP | 2005-216429 A | 8/2005 |
| JP | 2011-258259 A | 12/2011 |
| JP | 4911510 B2 | 1/2012 |
| JP | 2013-004158 A | 1/2013 |
| JP | 6281030 B1 | 1/2018 |
| KR | 20030063947 A | 7/2003 |
| KR | 20070109104 A | 11/2007 |
| KR | 20160134411 A | 11/2016 |
| KR | 20170053373 A | 5/2017 |
| KR | 20170093053 A | 8/2017 |
| KR | 20180011642 A | 2/2018 |
| KR | 20180101647 A | 9/2018 |
| KR | 20190046572 A | 5/2019 |
| TW | 201801079 A | 1/2018 |
| WO | 2014120477 | 8/2014 |
| WO | 2015030991 A1 | 3/2015 |
| WO | 2017171927 A1 | 10/2017 |
| WO | 2019222960 A1 | 11/2019 |
| WO | 2020010010 A1 | 1/2020 |
| WO | 2020117686 A1 | 6/2020 |
| WO | 2020247163 A1 | 12/2020 |
| WO | 2020247639 A1 | 12/2020 |

OTHER PUBLICATIONS

Kyungbae Park et al."Experiments and root cause analysis for acitve-precharge hammering fault in Ddr# Sdram under 3Xnm technology", Microelectronics Reliability 57 : Sep. 14, 2015, pp. 39-46.*

U.S. Appl. No. 17/731,529, titled "Apparatuses and Methods for Access Based Refresh Operations"; filed Apr. 28, 2022; pp. all pages of the application as filed.

International Application No. PCT/US20/23689, titled "Semiconductor Device Having Cam That Stores Address Signals", dated Mar. 19, 2020, pp. al pages of application as filed.

U.S. Appl. No. 16/797,658, titles "Apparatuses and Methods for Controlling Refresh Operations", filed Feb. 21, 2020, pp. al pages of application as filed.

U.S. Appl. No. 16/818,981 titled "Apparatuses and Methods for Staggered Timing of Targeted Refresh Operations" filed Mar. 13, 2020, pp. al pages of application as filed.

U.S. Appl. No. 16/824,460, titled "Semiconductor Device Performing Row Hammer Refresh Operation", dated Mar. 19, 2020, pp. al pages of application as filed.

U.S. Appl. No. 16/025,844, titled "Apparatus and Methods for Triggering Row Hammer Address Sampling", filed Jul. 2, 2018, pp. al pages of application as filed.

U.S. Appl. No. 16/783,063, titled "Apparatus and Methods for Triggering Row Hammer Address Sampling", dated Feb. 5, 2020, pp. al pages of application as filed.

U.S. Appl. No. 16/805,197, titled "Apparatuses and Methods for Calculating Row Hammer Refresh Addresses in a Semiconductor Device", dated Feb. 28, 2020, pp. al pages of application as filed.

U.S. Appl. No. 16/232,837, titled "Apparatuses and Methods for Distributed Targeted Refresh Operations", filed Dec. 26, 2018, pp. al pages of application as filed.

U.S. Appl. No. 16/818,989, titled "Semiconductor Device Performing Row Hammer Refresh Operation", dated Mar. 13, 2020, pp. al pages of application as filed.

U.S. Appl. No. 16/268,818, titled "Apparatuses and Methods for Managing Row Access Counts", filed Feb. 6, 2019, pp. al pages of application as filed.

(56) References Cited

OTHER PUBLICATIONS

U.S. Appl. No. 16/286,187 titled "Apparatuses and Methods for Memory Mat Refresh Sequencing" filed on Feb. 26, 2019, pp. al pages of application as filed.
U.S. Appl. No. 16/084,119, titled "Apparatuses and Methods for Pure-Time, Self Adopt Sampling for Row Hammer Refresh Sampling", filed Sep. 11, 2018, pp. al pages of application as filed.
U.S. Appl. No. 16/886,284 titled "Apparatuses and Methods for Access Based Refresh Timing" filed May 28, 2020, pp. al pages of application as filed.
U.S. Appl. No. 16/886,284, titled "Apparatuses and Methods for Access Based Refresh Timing", dated May 28, 2020, pp. al pages of application as filed.
U.S. Appl. No. 16/358,587, titled "Semiconductor Device Having Cam That Stores Address Signals", dated Mar. 19, 2019, pp. al pages of application as filed.
U.S. Appl. No. 16/375,716 titled "Apparatuses and Methods for Staggered Timing of Targeted Refresh Operations" filed on Apr. 4, 2019, pp. al pages of application as filed.
U.S. Appl. No. 16/411,573 titled "Apparatuses, Systems, and Methods for a Content Addressable Memory Cell" filed May 14, 2019, pp. al pages of application as filed.
U.S. Appl. No. 16/428,625 titled "Apparatuses and Methods for Tracking Victim Rows" filed May 31, 2019, pp. al pages of application as filed.
U.S. Appl. No. 16/432,604 titled "Apparatuses and Methods for Staggered Timing of Skipped Refresh Operations" filed Jun. 5, 2019, pp. al pages of application as filed.
U.S. Appl. No. 17/008,396 titled "Apparatuses and Methods for Staggered Timing of Targeted Refresh Operations" filed Aug. 31, 2020, pp. al pages of application as filed.
U.S. Appl. No. 16/513,400 titled "Apparatuses and Methods for Tracking Row Accesses" filed Jul. 16, 2019, pp. al pages of application as filed.
U.S. Appl. No. 16/548,027 titled "Apparatuses, Systems, and Methods for Analog Row Access Rate Determination" filed Aug. 22, 2019, pp. al pages of application as filed.
U.S. Appl. No. 16/549,942 titled "Apparatuses and Methods for Lossy Row Access Counting" filed Aug. 23, 2019, pp. al pages of application as filed.
U.S. Appl. No. 16/546,152 titled "Apparatuses and Methods for Analog Row Access Tracking" filed Aug. 20, 2019, pp. al pages of application as filed.
U.S. Appl. No. 16/549,411 titled "Apparatuses and Methods for Dynamic Refresh Allocation" filed Aug. 23, 2019, pp. al pages of application as filed.
U.S. Appl. No. 16/655,110 titled "Apparatuses and Methods for Dynamic Targeted Refresh Steals" filed Oct. 16, 2019, pp. al pages of application as filed.
U.S. Appl. No. 17/186,913 titled "Apparatuses and Methods for Dynamic Refresh Allocation" filed Feb. 26, 2021, pp. al pages of application as filed.
U.S. Appl. No. 17/187,002 titled "Apparatuses and Methods for Staggered Timing of Targeted Refresh Operations" filed Feb. 26, 2021, pp. al pages of application as filed.
U.S. Appl. No. 17/347,957 titled "Apparatuses and Methods for Controlling Steal Rates" filed Jun. 15, 2021, pp. al pages of application as filed.
International Application No. PCT/US19/40169 titled "Apparatus and Methods for Triggering Row Hammer Address Sampling" filed Jul. 1, 2019, pp. al pages of application as filed.
International Application No. PCT/US19/64028, titled "Semiconductor Device Performing Row Hammer Refresh Operation", dated Dec. 2, 2019, pp. al pages of application as filed.
International Application No. PCT/US20/26689, titled "Apparatuses and Methods for Staggered Timing of Targeted Refresh Operations", dated Apr. 3, 2020, pp. al pages of application as filed.
PCT Application No. PCT/US20/32931, titled "Apparatuses and Methods for Controlling Steal Rates", dated May 14, 2020, pp. al pages of application as filed.

U.S. Appl. No. 16/788,657, titled "Semiconductor Device Performing Row Hammer Refresh Operation", dated Feb. 12, 2020, pp. al pages of application as filed.
U.S. Appl. No. 17/324,621 titled "Apparatuses and Methods for Pure-Time, Self-Adopt Sampling for Row Hammer Refresh Sampling" filed May 19, 2021, pp. al pages of application as filed.
U.S. Appl. No. 15/881,256 entitled 'Apparatuses and Methods for Detecting a Row Hammer Attack With a Bandpass Filter' filed on Jan. 26, 2018, pp. al pages of application as filed.
U.S. Appl. No. 17/662,733, titled "Apparatuses, Systems, and Methods for Identifying Victim Rows in a Memorydevice Which Cannot Be Simultaneously Refreshed" filed May 10, 2022, pp. al pages of application as filed.
U.S. Appl. No. 16/425,525 titled "Apparatuses and Methods for Tracking All Row Accesses" filed May 29, 2019, pp. al pages of application as filed.
U.S. Appl. No. 16/427,105 titled "Apparatuses and Methods for Priority Targeted Refresh Operations" filed May 30, 2019, pp. al pages of application as filed.
U.S. Appl. No. 16/427,140 titled "Apparatuses and Methods for Tracking Row Access Counts Between Multiple Register Stacks" filed May 30, 2019, pp. al pages of application as filed.
U.S. Appl. No. 16/437,811 titled "Apparatuses, Systems, and Methods for Determining Extremum Numerical Values" filed Jun. 11, 2019, pp. al pages of application as filed.
U.S. Appl. No. 16/537,981 titled "Apparatuses and Methods for Controlling Targeted Refresh Rates" filed Aug. 12, 2019, pp. al pages of application as filed.
U.S. Appl. No. 16/994,338 titled "Apparatuses, Systems, and Methods for Memory Directed Access Pause" filed Aug. 14, 2020, pp. al pages of application as filed.
U.S. Appl. No. 16/997,766 titled "Refresh Logic Circuit Layouts Thereof" filed Aug. 19, 2020, pp. al pages of application as filed.
U.S. Appl. No. 16/997,659 titled "Apparatuses, Systems, and Methods for Refresh Modes" filed Aug. 19, 2020, pp. al pages of application as filed.
U.S. Appl. No. 17/095,978 titled "Apparatuses and Methods for Controlling Refresh Timing" filed Nov. 12, 2020, pp. al pages of application as filed.
U.S. Appl. No. 17/127,654 titled "Apparatuses and Methods for Row Hammer Based Cache Lockdown" filed Dec. 18, 2020, pp. al pages of application as filed.
U.S. Appl. No. 17/175,485 titled "Apparatuses and Methods for Distributed Targeted Refresh Operations" filed Feb. 12, 2021, pp. al pages of application as filed.
U.S. Appl. No. 15/789,897, entitled "Apparatus and Methods for Refreshing Memory", filed Oct. 20, 2017, pp. al pages of application as filed.
U.S. Appl. No. 15/796,340, entitled: "Apparatus and Methods for Refreshing Memory" filed on Oct. 27, 2017, pp. al pages of application as filed.
U.S. Appl. No. 16/012,679, titled "Apparatuses and Methods for Multiple Row Hammer Refresh Address Sequences", filed Jun. 19, 2018, pp. al pages of application as filed.
U.S. Appl. No. 16/020,863, titled "Semiconductor Device", filed Jun. 27, 2018, pp. al pages of application as filed.
U.S. Appl. No. 16/112,471 titled "Apparatuses and Methods for Controlling Refresh Operations" filed Aug. 24, 2018, pp. al pages of application as filed.
U.S. Appl. No. 16/160,801, titled "Apparatuses and Methods for Selective Row Refreshes" filed on Oct. 15, 2018, pp. al pages of application as filed.
U.S. Appl. No. 16/176,932, titled "Apparatuses and Methods for Access Based Refresh Timing", filed Oct. 31, 2018, pp. al pages of application as filed.
U.S. Appl. No. 16/208,217, titled "Semiconductor Device Performing Row Hammer Refresh Operation", filed Dec. 3, 2018, pp. al pages of application as filed.
U.S. Appl. No. 16/230,300, titled "Apparatuses and Methods for Staggered Timing of Targeted Refresh Operations" filed Dec. 21, 2018, pp. al pages of application as filed.

(56) References Cited

OTHER PUBLICATIONS

U.S. Appl. No. 16/231,327 titled "Apparatuses and Methods for Selective Row Refreshes", filed on Dec. 21, 2018, pp. al pages of application as filed.
U.S. Appl. No. 16/237,291, titled "Apparatus and Methods for Refreshing Memory", filed Dec. 31, 2018, pp. al pages of application as filed.
U.S. Appl. No. 16/290,730, titled "Semiconductor Device Performing Row Hammer Refresh Operation", filed Mar. 1, 2019, pp. al pages of application as filed.
U.S. Appl. No. 16/374,623, titled "Semiconductor Device Performing Row Hammer Refresh Operation", filed Apr. 3, 2019, pp. al pages of application as filed.
U.S. Appl. No. 16/411,698 title "Semiconductor Device" filed May 14, 2019, pp. al pages of application as filed.
U.S. Appl. No. 16/427,330 titled "Apparatuses and Methods for Storing Victim Row Data" filed May 30, 2019, pp. al pages of application as filed.
U.S. Appl. No. 16/431,641 titled "Apparatuses and Methods for Controlling Steal Rates" filed Jun. 4, 2019, pp. al pages of application as filed.
U.S. Appl. No. 16/682,606, titled "Apparatuses and Methods for Distributing Row Hammer Refresh Events Across a Memory Device ", filed Nov. 13, 2019, pp. al pages of application as filed.
U.S. Appl. No. 17/654,035, titled "Apparatuses and Methods for Dynamic Targeted Refresh Steals", filed Mar. 8, 2022; pp. all pages of application as filed.
U.S. Appl. No. 15/876,566 entitled 'Apparatuses and Methods for Calculating Row Hammer Refresh Addresses in a Semiconductor Device' filed on Jan. 22, 2018, pp. al pages of application as filed.
U.S. Appl. No. 15/656,084, titled "Apparatuses and Methods for Targeted Refreshing of Memory" filed Jul. 21, 20217, pp. al pages of application as filed.
U.S. Appl. No. 17/226,975, titled "Apparatuses and Methods for Staggered Timing of Skipped Refresh Operations" filed Apr. 9, 2021, pp. al pages of application as filed.
U.S. Appl. No. 16/459,520 titled "Apparatuses and Methods for Monitoring Word Line Accesses", filed Jul. 1, 2019, pp. al pages of application as filed.
PCT Application No. PCT/US18/55821 "Apparatus and Methods for Refreshing Memory" filed Oct. 15, 2018, pp. al pages of application as filed.
U.S. Appl. No. 15/715,846, entitled "Semiconductor Device", filed Sep. 26, 2017, pp. al pages of application as filed.
U.S. Appl. No. 15/888,993, entitled "Apparatuses and Methods for Controlling Refresh Operations", filed Feb. 5, 2018, pp. al pages of application as filed.
U.S. Appl. No. 16/190,627 titled "Apparatuses and Methods for Targeted Refreshing of Memory" filed Nov. 14, 2018, pp. al pages of application as filed.
U.S. Appl. No. 17/030,018, titled "Apparatuses and Methods for Controlling Refresh Operations", filed Sep. 23, 2020, pp. al pages of application as filed.
U.S. Appl. No. 15/281,818, entitled: "Semiconductor Device" filed on Sep. 30, 2016, pp. al pages of application as filed.
Kim, et al., "Flipping Bits in Memory Without Accessing Them: An Experimental Study of DRAM Disturbance Errors", IEEE, Jun. 2014, 12 pgs.
U.S. Appl. No. 18/064,773, filed Dec. 12, 2022, titled, "Apparatuses and Methods for Access Based Refresh Timing," pp. all pages of application as filed.
Anonymous: "Frequency—Wikipedia", Dec. 17, 2018, retrieved from URL: https://en.wikipedia.org/w/index.php?title=Frequency&oldid=874192848; pp. all.
U.S. Appl. No. 18/746,551 titled "Apparatuses and Methods for Direct Refresh Management Attack Identification" filed Jun. 18, 2024, pp. all pages of the application as filed.
U.S. Appl. No. 18/747,740, titled "Apparatuses and Methods Refresh Rate Register Adjustment Based On Refresh Queue" filed Jun. 19, 2024, pp. all pages of application as filed.
U.S. Appl. No. 18/774,730 titled "Apparatuses and Methods for Controller Signaling of Refresh Operations" filed Jul. 16, 2024, pp. all pages of the application as filed.

* cited by examiner

APPARATUSES AND METHODS FOR ACCESS BASED TARGETED REFRESH OPERATIONS

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). When accessed, the memory cell may be coupled to a digit line (or bit line), and a voltage on the digit line may change based on the information stored in the coupled memory cell.

In volatile memory devices, the information may decay over time. To prevent information from being refreshed, the information may be periodically refreshed (e.g., by restoring the charge on a memory cell to an initial level). However, refresh operations may require time which could have otherwise been used for access operations in the memory.

DETAILED DESCRIPTION

Figure 1:
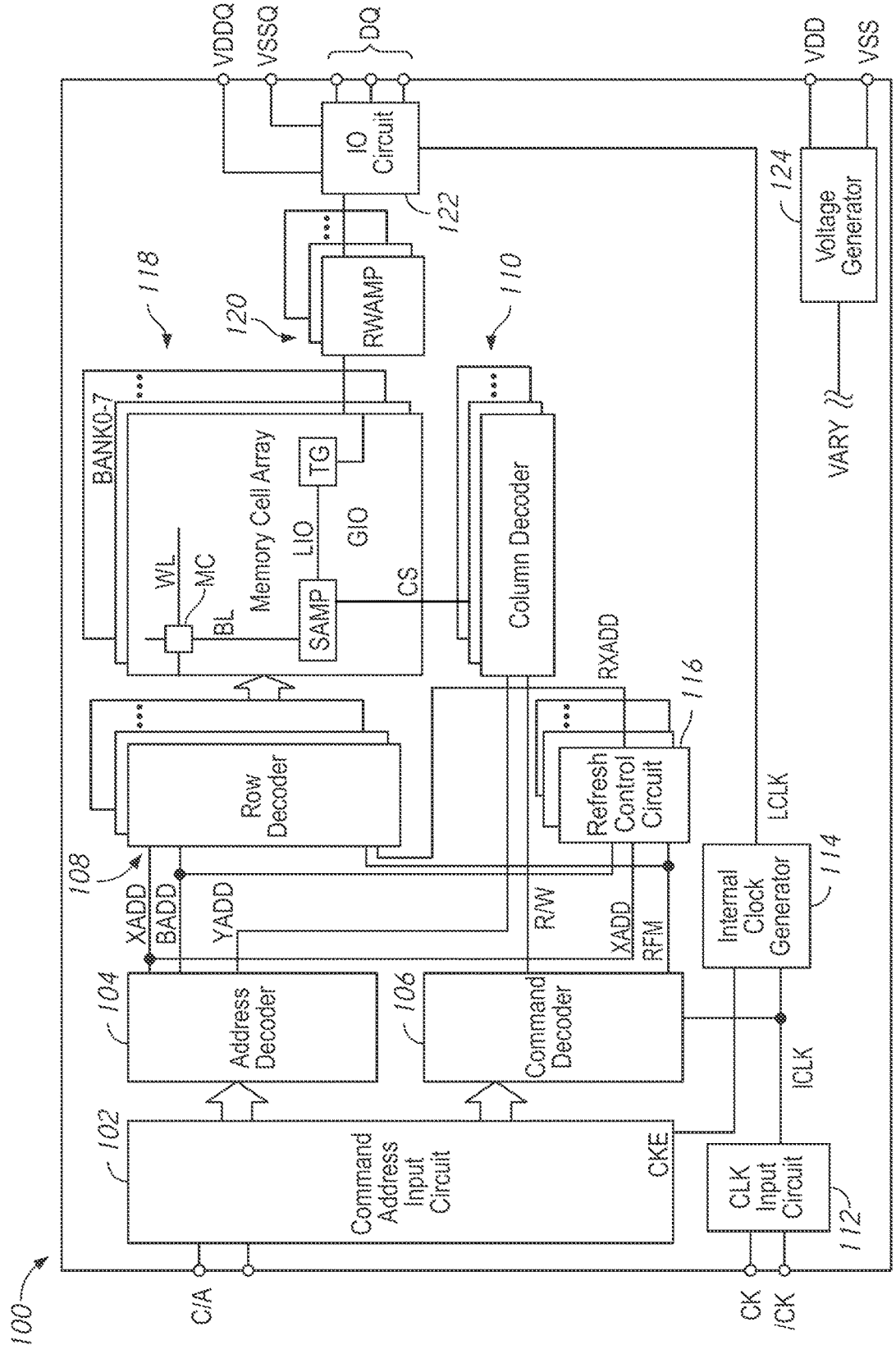
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Memory arrays may generally include a number of memory cells arranged at the intersection of word lines (rows) and bit lines/digit lines (columns). To prevent information from being lost, the memory may refresh memory cells on a row-by-row basis (or in sets of rows). Over the course a refresh cycle, the memory may refresh the memory cells as part of sequential refresh operations. The memory may have a refresh period, tREFI, which determines the maximum timing between refresh operations in order to ensure that all memory cells are refreshed over the course of a refresh cycle. For example, tREFI may be based on the expected time at which any individual memory cell needs to be refreshed divided by a total number of refresh operations in a refresh cycle (e.g., a number of rows or a number of rows refreshed per refresh operation). The refresh period tREFI may be relatively short (e.g., <10 μsec). The memory may refresh a first word line (or a first set of word lines) as part of a first sequential refresh operation, then refresh a second word line (or set of word lines) as part of a second sequential refresh operation and so forth until all word lines have been refreshed, then may restart from the beginning of the sequence.

Certain access patterns to the memory may change a rate at which information decays in the memory cells. For example, a row hammer may be repeated access to an 'aggressor' row of the memory, which may increase a rate of information decay in memory cells along nearby 'victim' word lines. Since the information in the victim word lines may decay faster than the assumptions used to calculate tREFI, it may be important to identify aggressors, and perform targeted refresh operations on the victims of those identified aggressors. In conventional memories, refresh operations may be called for every tREFI. Targeted refresh operations may 'steal' a timeslot which is otherwise set aside for a sequential refresh operation. However, this may inefficient, as targeted refresh operations need only be performed when an aggressor has been detected. Accordingly, conventional memories may include relatively logic which manages when to perform targeted refresh operations, what to do if a targeted refresh operation is called for but not aggressor is detected, how to adjust a rate of targeted to sequential refresh operations etc.

The present disclosure is drawn to apparatuses, systems, and methods for access based targeted refresh operations. A memory includes a memory bank which is divided into two or more sub-banks. Each sub-bank is associated with a refresh control circuit which includes an aggressor detector. When an aggressor address is detected in the associated sub-bank, the next time a word line is accessed in a different sub-bank, a targeted refresh operation is performed on the victims of the detected aggressor. In this manner, targeted refresh operations may occur 'as needed' in the sub-banks with timing based on accesses in the other sub-banks. This may simplify the logic for determining when to perform targeted refresh operations.

In some embodiments, the use of access operations in other sub-banks to control the timing of targeted refresh operations may be advantageous. Some memories may track accesses to each row of the memory to determine which rows are aggressors. For example, each row may have memory cells set aside which store an access count associated with that row. Based on the access count (e.g., a comparison to a threshold), the row may be determined to be an aggressor. When a targeted refresh operation is performed on the victims of that row, the count value should be reset, which requires accessing the aggressor row (to read, modify and write the count value). However, this requires time to access the aggressor row. After targeted refresh operations have refreshed the victims of the aggressor, the aggressor row may be accessed and it's count value reset responsive to a word line being accessed in a different sub-bank. This may allow the count value along the aggressor to be reset without interrupting normal access operations.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. As explained in more detail herein, each bank may be further divided into two or more sub-banks. While embodiments where each bank includes two sub-banks are generally described herein, other embodiments may include more sub-banks per bank.

Each memory sub-bank includes a plurality of word lines WL, a plurality of bit lines BLT, and a plurality of memory cells MC arranged at intersections of the plurality of word lines WL and the plurality of bit lines BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. In some embodiments, components such as the row and column decoders and refresh control circuit 116 which are repeated on a per-bank basis may also include components which are repeated on a per-sub-bank basis. For example, there may be a refresh control circuit 116 for each sub-bank.

The bit lines BL are coupled to a respective sense amplifier (SAMP). Read data from the bit line BL is amplified by the sense amplifier SAMP, and transferred to read/write amplifiers 120 over local data lines (LIO), transfer gate (TG), and global data lines (GIO). Conversely, write data outputted from the read/write amplifiers 120 is transferred to the sense amplifier SAMP over the complementary main data lines GIO, the transfer gate TG, and the complementary local data lines LIO, and written in the memory cell MC coupled to the bit line BL.

The semiconductor device 100 may employ a plurality of external terminals, such as solder pads, that include command and address (C/A) terminals coupled to a command and address bus to receive commands and addresses, clock terminals to receive clocks CK and/CK, data terminals DQ coupled to a data bus to provide data, and power supply terminals to receive power supply potentials VDD, VSS, VDDQ, and VSSQ.

The clock terminals are supplied with external clocks CK and/CK that are provided to an input circuit 112. The external clocks may be complementary. The input circuit 112 generates an internal clock ICLK based on the CK and/CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data. The input/output circuit 122 may include a number of interface connections, each of which may be couplable to one of the DQ pads (e.g., the solder pads which may act as external connections to the device 100).

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The column decoder 110 may provide a column select signal CS, which may activate a selected one of the sense amplifiers SAMP. The address decoder 104 may also supply a decoded bank address BADD, which may indicate the bank of the memory array 118 containing the decoded row address XADD and column address YADD. The row address XADD may indicate the sub-bank within the bank indicated by BADD.

The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is provided along the data bus and output to outside from the data terminals DQ via the input/output circuit 122.

The device 100 may receive an access command which is a write command. When the write command is received, and a bank address, a row address and a column address are timely supplied with the write command, write data supplied to the data terminals DQ is provided along the data bus and written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 includes refresh control circuits 116, each associated with a bank or sub-bank of the memory array 118. Each refresh control circuit 116 may determine when to perform a refresh operation on the associated sub-bank. The refresh control circuit 116 provides a refresh address RXADD (along with one or more refresh signals, not shown in FIG. 1). The row decoder 108 performs a refresh operation on one or more word lines associated with RXADD.

The refresh control circuit 116 may perform multiple types of refresh operation, which may determine how the address RXADD is generated, as well as other details such as how many word lines are associated with the address RXADD. For example, the refresh control circuit 116 may perform sequential refresh operations, where the refresh address RXADD is generated based on a sequence of refresh operations. For example, after a first sequential refresh operation with an address RXADD, the next sequential refresh operation may generate an address RXADD+1. Sequential refresh addresses may be associated with multiple word lines, for example by truncating the address RXADD compared to a full row address XADD, and refreshing all word lines which share the truncated portion in common. Over the course of a refresh cycle, the sequential refresh operations may refresh all word lines in the sub array (e.g., by sequentially generating addresses associated with all word lines) and then the sequence may recycle.

The refresh control circuit 116 may perform sequential refresh operations with timing based on a refresh interval tREFI. The refresh interval tREFI may be based on expected timing for refreshing any given word line (e.g., based on an expected rate of information decay) as well as the number of refresh operations required to complete a refresh cycle (e.g., the number of sequential refresh operations per refresh cycle). Each tREFI, the refresh control circuit 116 may perform a sequential refresh operation. For example, a refresh signal REF may be generated each time tREFI elapses and responsive to the refresh signal REF, one or more sequential refresh operations may be performed.

As well as sequential refresh operations, the refresh control circuit 116 may perform targeted refresh operations, where the refresh address RXADD is based on a detected aggressor word line. Certain access patterns to a row may cause an increased rate of data decay in the memory cells of other nearby rows. For example, multiple accesses to a single row, a 'row hammer', may increase the rate of decay in memory cells along the nearby word lines. Since these memory cells may decay faster than the timing expected by tREFI, it is useful to identify these aggressor rows so that their victims can be refreshed.

The refresh control circuit may include logic which detects aggressors and then generates a refresh address RXADD based on the detected aggressor as part of a targeted refresh operation. For example, if the aggressor is AggXADD, then the refresh control circuit may refresh adjacent and/or nearby word lines such as one or more of AggXADD+1, AggXADD−1, AggXADD+2, AggXADD−2, etc. Various criterion may be used to detect aggressors. For example, the memory may count a number of accesses to different word lines (e.g., based on the row addresses XADD which are provided along a row address bus from the address decoder 104) and designate a row address as an aggressor when that count crosses a threshold. In some embodiments, the count of accesses to a given row may be stored along memory cells of that row. Accordingly, when a word line is accessed, the count may be read from the memory cells of that row, modified (e.g., incremented), compared to a threshold, and the changed count (e.g., either incremented or reset if the count was above the threshold) may be written back.

While the present disclosure may generally refer to detecting aggressor addresses and their victims, it should be understood that these term are used to mean rows which are used to calculate targeted refresh addresses. For example, it is not necessary that the aggressor address undergo an attack, such as a row hammer, or that there is actual increased data decay in the victims. In some embodiments, the memory may use sampling, which may introduce an aspect of randomness into the selection of aggressor addresses.

The refresh control circuit 116 may perform targeted refresh operations on a sub-bank with timing based, in part, on accesses to other sub-banks of the same bank. For example, if there are two sub-banks per bank, after an aggressor is detected in a second sub-bank when a word line is accessed in the first sub-bank, the refresh control circuit 116 may refresh one or more victims in the second sub-bank based on the detected aggressor. In this manner, targeted refresh commands may be performed in an 'on-demand' fashion, with timing based on accesses to different sub-banks The refresh control circuit 116 may also receive refresh management RFM commands which may cause the refresh control circuit 116 to perform a targeted refresh operation. The RFM command may be issued by a controller external to the device 100.

The power supply terminals are supplied with power supply potentials VDD and VSS. The power supply potentials VDD and VSS are supplied to an internal voltage generator circuit 124. The internal voltage generator circuit 124 generates various internal potentials VARY, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

FIG. 2 is a block diagram of refresh logic according to some embodiments of the present disclosure. The refresh logic may represent a portion of a memory device, such as the device 100 of FIG. 1, in some embodiments. The refresh logic 200 includes a refresh control circuit 210 (e.g., 116 of FIG. 1) and a pair of sub-banks 202 and 206, which are part of a same memory bank (e.g., one of the memory banks of the array 118 of FIG. 1). Once the refresh control circuit 210 has detected an aggressor address in one of the sub-banks, then when a word line is accessed in the other sub-bank, a targeted refresh may be performed. In the example of FIG. 2, a refresh control circuit 210 associated with the second sub-bank 206 is shown. Each sub-bank may have a similar refresh control circuit.

The refresh control circuit 210 includes an aggressor detector circuit 212 which activates a flag when an aggressor address RHR-RA has been detected in the associated sub-bank 206. Responsive to an activation command ACT, a logic circuit 218 may provide a targeted refresh signal RHR if the flag is active. If the flag is active, a comparator 214 may determine if the accessed row address Act-RA matches the aggressor RHR-RA, and if it does not, then sub-bank logic 216 may determine if the address Act-RA and RHR-RA are in a same sub-bank (e.g., is Act-RA in sub-bank B 206). If they are not, the sub-bank logic 216 provides a complimentary match signal matchF at an active level. If both the RHR command and matchF are active, then a logic circuit 220 may provide the RHR command to the sub-bank 206. A refresh address generator 222 provides one or more refresh addresses RXADD responsive to either a refresh command REF or the RHR command. If the RHR command is active, then the refresh address generator 222 may generate refresh address(es) based on RHR-RA. Responsive to the RHR command from logic circuit 220, a row decoder (not shown) may refresh one or more word lines associated with RXADD in the sub-bank 206.

The aggressor detector circuit 212 may detect aggressor addresses in the sub-bank 206 based on one or more criteria. For example, the aggressor detector circuit 212 may count accesses to different addresses and if an access count crosses a threshold may determine that address to be an aggressor. In some embodiments, the aggressor detector 212 may receive the accessed address Act-RA and use that to detect an aggressor. In some embodiments, the access counts may be stored in the memory array (e.g., along memory cells of the row associated with that memory count), and the aggressor detector may receive those counts when the row is accessed. Various other techniques to determine aggressor addresses may be used in other example embodiments. When the aggressor detector circuit 212 detects an aggressor it may activate a flag and provide the aggressor address as RHR-RA.

During an example access operation, a command decoder (e.g., 106 of FIG. 1) provides an activation signal ACT while an address decoder (e.g., 104 of FIG. 1) provides an accessed address Act-RA. The address Act-RA may be associated with a word line 204 in the first sub-bank. Responsive to the address Act-RA and the activation signal ACT, the word line 204 is accessed.

A comparator circuit 214 may receive the flag and the RHR-RA from the aggressor detector 212 as well as an accessed address Act-RA. If the flag is active (e.g., if there is a detected aggressor) then the comparator 214 may compare the address RHR-RA and Act-RA to determine if they are the same. If they are not the same, then a sub-bank logic circuit 216 may determine if the address Act-RA is in the sub-bank associated with the refresh control circuit 210. For example, the logic 216 may check a portion of the row address Act-RA which specifies a sub-bank to determine if the address Act-RA is associated with sub-bank B 206. IF the address is not associated with sub-bank B, then the logic 216 provides a signal matchF at an active level (e.g., at a high logical level).

A logic circuit 218 receives the activation command ACT (e.g., from a command decoder) and the flag signal from the aggressor detector 212. If the flag signal is active (e.g., if an aggressor has been detected) then the logic circuit may provide an RHR command. For example, the logic 218 may be an AND gate with inputs coupled to flag and to ACT. A second logic circuit 220 may provide the RHR command to the sub-bank (or to a row decoder associated with the sub-bank) when both the signal matchF and the RHR command are active. For example, the second logic circuit 220 may also be an AND gate with input terminals coupled to RHR from the first logic circuit 218 and to matchF from the sub-bank logic 216. If both are active, then the RHR command is provided to the sub-bank 206.

The refresh logic 210 includes a refresh address generator 222. The refresh address generator 222 includes a CBR counter circuit 224 which generates sequential refresh addresses as the refresh address RXADD when a refresh signal REF is active and a targeted refresh address generator 226 which generates a targeted refresh address as the refresh address RXADD when a targeted refresh signal RHR is active. Responsive to a refresh signal REF, the CBR counter circuit 224 may provide a refresh address RXADD as part of a sequential refresh operation. For example, the CBR counter circuit 224 may updates an address and provides it as the refresh address RXADD as part of a sequential refresh operation. For example, a previous sequential refresh address may be incremented by the CBR counter circuit 224 to generate a new sequential refresh address. In some embodiments, the refresh address generator 222 may provide multiple addresses and perform multiple sequential refresh operations responsive to the signal REF. In some embodiments, the refresh control circuit 210 may perform different numbers of sequential refresh operations responsive to activations of REF. For example, the refresh control circuit 210 may alternate between two sequential refresh operations and one sequential refresh operation.

The targeted refresh address generator 226 may provide a targeted refresh address RXADD based on the aggressor address RHR-RA when the signal RHR is provided. For example, the address RXADD may represent a word line which near to a word line associated with RHR-RA. For example the address RXADD may be one of the word lines adjacent to RHR-RA (e.g., RHR-RA+1 and RHR-RA-1). Other relationships may also be used. In some embodiments, the refresh address generator 222 may provide multiple refresh addresses RXADD responsive to the signal RHR (e.g., both RHR-RA+1 and RHR-RA-1).

Responsive to the signal RHR, a word line associated with RXADD is refreshed in the sub-bank 206. For example, a word line 208 may be refreshed. In this manner, a targeted refresh operation may be performed on the word line 208 in the second sub-bank 206 while the word line 204 in the first sub-bank 202 is being accessed. After refreshing the victim(s) of the identified aggressor RHR-RA, the aggressor detector 212 may reset the flag to an inactive (or unset) state.

Figure 2A:
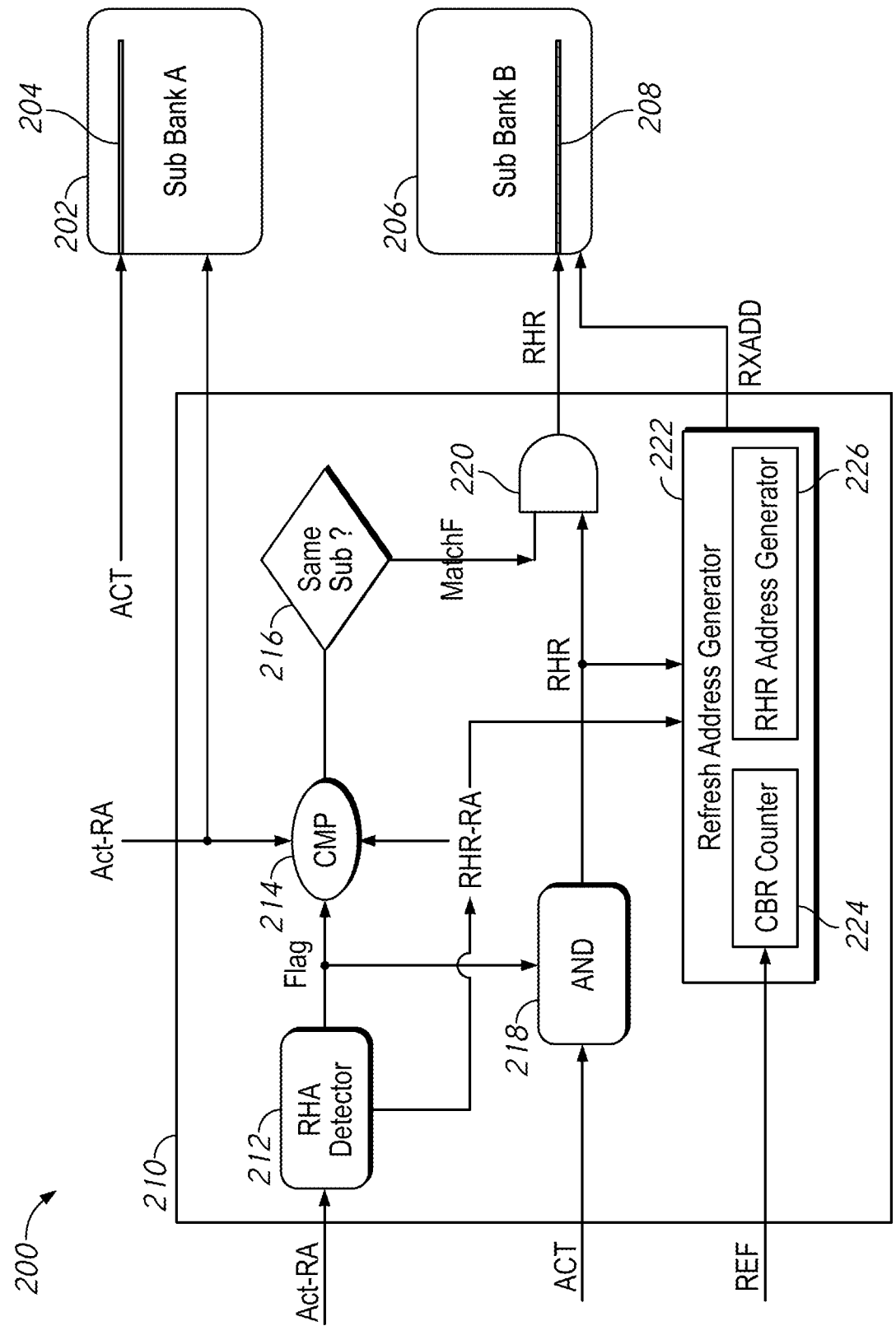
FIG. 2A is a block diagram of refresh logic according to some embodiments of the present disclosure.
Figure 2B:
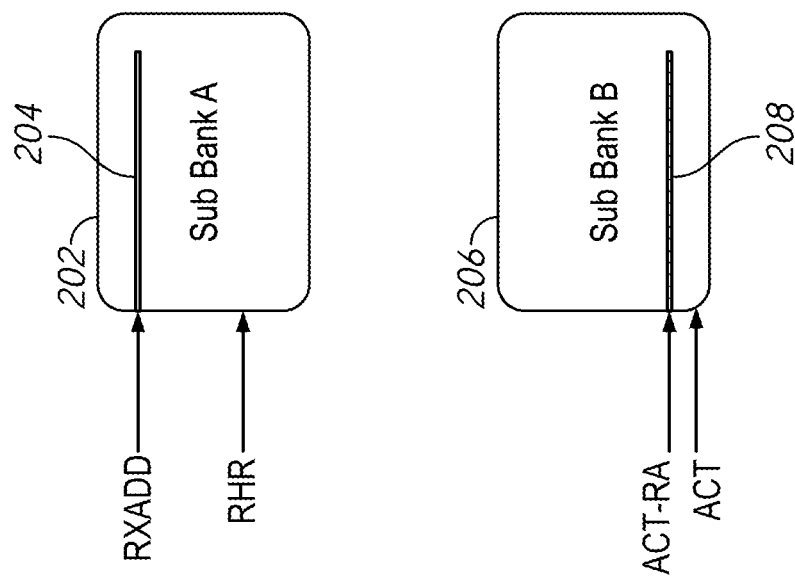
FIG. 2B is a block diagram of refresh operations according to some embodiments of the present disclosure.

FIG. 2B is a block diagram of refresh operations according to some embodiments of the present disclosure. FIG. 2A shows refresh logic performing a targeted refresh operation on a second sub-bank when an access operation is performed in a first sub-bank. FIG. 2B shows a subsequent operation which may be performed on the same sub-banks 202 and 206. For the sake of brevity the details of the refresh logic 210 shown in FIG. 2A are not repeated with respect to FIG. 2B. Each of the sub-banks 202 and 206 may be associated with refresh logic similar to the refresh logic 210 of FIG. 2A.

FIG. 2B shows a targeted refresh being performed on the first sub-bank 202 when an access is performed on the second sub-bank 206. For example, an address decoder (e.g., 104 of FIG. 1) may provide an access address ACT-RA, while a command decoder (e.g., 106 of FIG. 1) provides a row activation command ACT. In the situation depicted in FIG. 2B, the address ACT-RA is associated with a word line 208 in a second sub-bank 206. A refresh logic circuit (not shown) associated with the first sub-bank 202 also receives the signals ACT and ACT-RA. Based on a determination that the address ACT-RA is associated with the second sub-bank 206 (and a previous identification of an aggressor in the first sub-bank 202), a refresh address RXADD and refresh signal RHR may be generated. In this manner, a word line 204 in the first sub-bank 202 may be refreshed responsive to a word line 208 in the second sub-bank being accessed.

Figure 3:
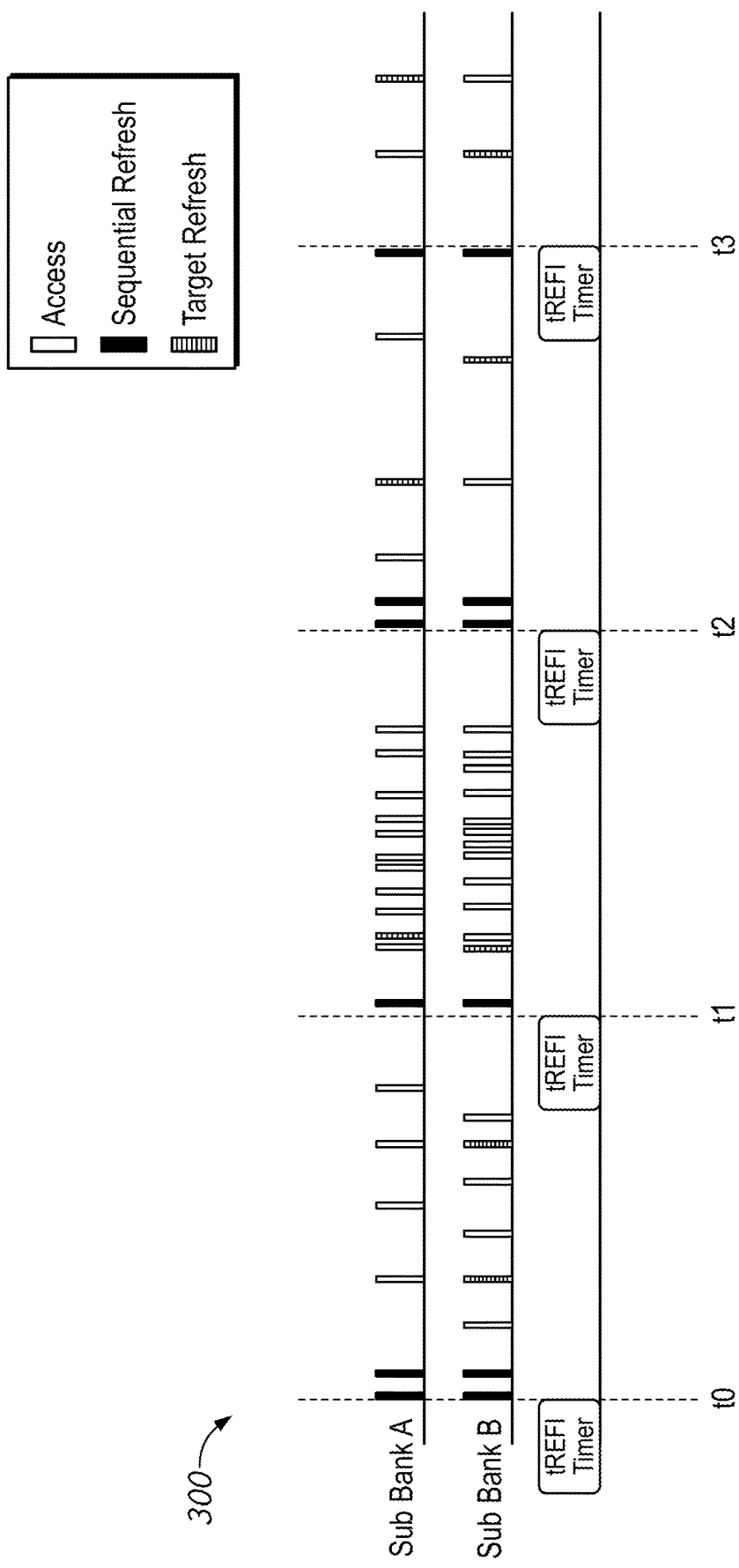
FIG. 3 is a timing diagram of refresh operations in a memory according to some embodiments of the present disclosure.

FIG. 3 is a timing diagram of refresh operations in a memory according to some embodiments of the present disclosure. The timing diagram 300 may represent refresh operations in a device such as the memory device 100 of FIG. 1 and/or the refresh logic 200 of FIG. 2.

The timing diagram shows several refresh intervals, beginning at times t0, t1, t2, and t3, each of which is marked by the activation of tREFI timer signal. The different refresh intervals may be separated by a time tREFI, which may be a setting of the memory. In some embodiments, the refresh intervals may be marked by a refresh signal REF (not shown in FIG. 3).

During the first refresh interval beginning at t0, a refresh signal causes two sequential refresh operations to be performed in both sub-banks. Before the time to, an aggressor address has been detected in sub-bank B, but not in sub-bank A. After t0, a first access is performed in sub-bank B. Since there is no detected aggressor in sub-bank A (e.g., the flag for sub-bank A is inactive/unset), no targeted refresh is performed in sub-bank A responsive to the access in sub-bank B. However, when a row is accessed in sub-bank A, a targeted refresh operation may be performed in sub-bank B. During subsequent accesses to sub-bank B, a second aggressor may be detected. Accordingly, during a later access to sub-bank A, a second targeted refresh may be performed in sub-bank A.

During a second refresh interval beginning at t1, only a single sequential refresh operation may be performed. At the time t1, aggressors have been located in both of the sub-banks. Accordingly, after a first access in the first sub-bank, a targeted refresh is performed in sub-bank B. After a first access in the sub-bank B, a targeted refresh is performed in the sub-bank A. Since no further aggressors are detected in the period between t1 and t2, no further targeted refresh operations are performed.

During a third refresh interval beginning at t2, two sequential refresh operations are performed. After that, an access is performed in the sub-bank A, which is determined to be an aggressor. Accordingly, a next time sub-bank B is accessed, a targeted refresh operation is performed in sub-bank A. Similarly at the refresh period beginning with t3, targeted refresh operations are performed in both sub-banks responsive to access operations in the opposite sub-bank.

Figure 4:
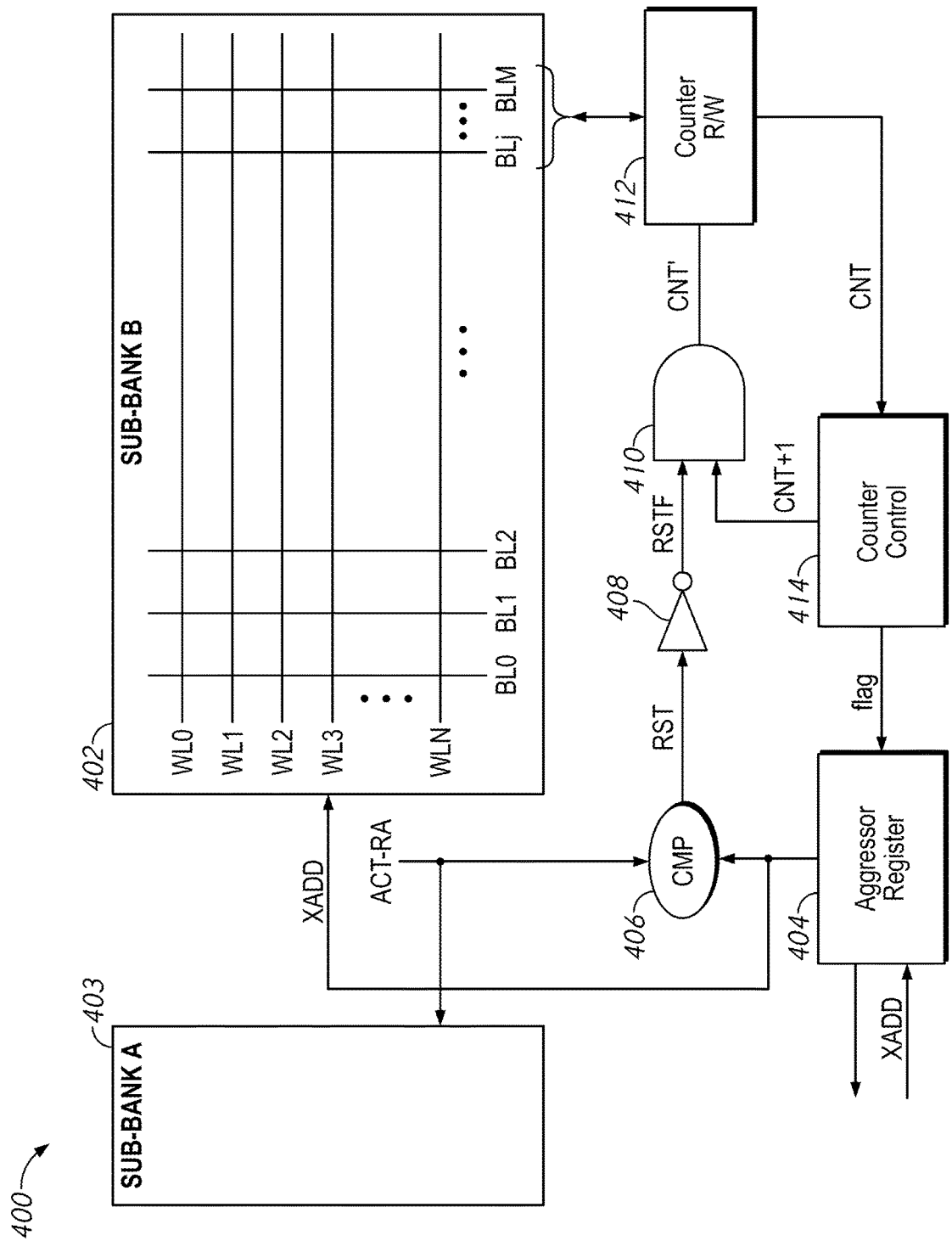
FIG. 4 is a block diagram of refresh logic according to some embodiments of the present disclosure.

FIG. 4 is a block diagram of refresh logic according to some embodiments of the present disclosure. FIG. 4 shows refresh logic which may be included in the memory device 100 of FIG. 1, and which may implement a portion of the refresh logic 200 of FIG. 2. FIG. 4 shows a sub-bank 402 (e.g., 206 of FIGS. 2A-B) as well as a sub-bank 403 (e.g., 202 of FIGS. 2A-B) and several other components which may be part of a refresh control circuit (e.g., 210 of FIGS. 2A-B).

FIG. 4 shows an example embodiment where access counts used to determine if a row is an aggressor are stored along the rows of the memory array. When that row is accessed, the count may be read out from the word line, changed (e.g., incremented), and compared to a threshold. If it meets or exceeds a threshold it may be judged to be an aggressor, and an aggressor flag (e.g., flag of FIG. 2A) may be set. Responsive to the flag being set, the aggressor address XADD may be stored in an aggressor register (which may be a component of the refresh control circuit 210 of FIG. 2A) and the count value of that row address XADD may be reset. In the embodiment of FIG. 4, the refresh logic 400 may reset the aggressor count performing the targeted refresh responsive to an access in the other sub-bank 403 of the memory.

The refresh logic 400 shows a sub-bank 402 which includes a number of word lines and bit lines. Memory cells (not shown) are located at the intersection of the word and bit lines. Certain memory cells along each row are set aside to store a count value associated with that row. In the example embodiment of FIG. 4, bit lines along the end of word line, the bit line BLj to BLm are used, however other placements may be used in other values. The memory cells at the intersection of the bit lines BLj to BLm with each word line may store a binary number which represents a count of accesses to that word line. The sub-bank 403 may also have a similar structure (e.g., bit lines, word lines, memory cells, count values in memory cells, etc.) but for clarity they are not shown in FIG. 4.

When a word line is accessed (e.g., responsive to the access address ACT-RA and an activation signal ACT), the count value CNT associated with that row may be read out by a counter read/write (R/W) circuit 412. A counter control circuit 414 (which may be part of an aggressor detector circuit such as 212 of FIG. 2) may change the count value. In the example of FIG. 4, the counter control circuit 414 may increment the count (e.g., to CNT+1). The count control circuit 414 compares the updated count value to a threshold. If the updated count value meets or exceeds the threshold, the counter control circuit 414 may set a flag signal (e.g., change the signal flag from logical low to logical high) which indicates that the address ACT-RA is an aggressor.

The changed count value CNT+1 is provided to a logic gate 410, which provides it as a new count value CNT' to the counter R/W circuit 412 when a reset signal RSTF is at a high logical level. Responsive to receiving an updated count value, the counter R/W circuit 412 writes the updated value CNT' back to the memory cells of the sub-bank 402.

An aggressor register 404 (e.g., part of a refresh address generator 222 of FIG. 2) receives the flag signal flag and responsive to the signal flag being set (e.g., being changed to an active state) the aggressor register 404 captures a current value of the address XADD along the row address bus. The address XADD may be the address ACT-RA which was accessed and which associated count value crossed the threshold.

A comparator 406 may receive an activation address ACT-RA as part of a subsequent access operation. The comparator 406 compares the address ACT-RA and the stored aggressor address XADD in the aggressor register 404 and determines if they are in the same sub-bank. If they are not (e.g., if ACT-RA is associated with sub-bank 403), then the comparator 406 provides a reset signal RST at an active level. An inverter 408 provides the signal RSTF at a low logical level when the signal RST is at an active level. When the signal RSTF is at a low logical level, the logic gate 410 provides a value of CNT' which is a reset value. For example, the logic gate 410 may be AND logic, and when the signal RSTF is at a low logical level, the bits of the value CNT' may be at a low logical level (e.g., the binary number may be 0). Accordingly, when the aggressor register 404 stores an aggressor address XADD in a sub-bank 402, and a subsequent access address is provided associated with a second sub-bank 403, then a reset count value CNT' is written to the memory cells which store the count along a word line associated with RST-RA (e.g., the aggressor word line). In some embodiments, the comparator 406 may be the same comparison logic used to determine if the aggressor and accessed address are in the same sub-bank (e.g., the comparator 406 may represent the comparator 214 and sub-bank logic 216 of FIG. 2).

Figure 5:
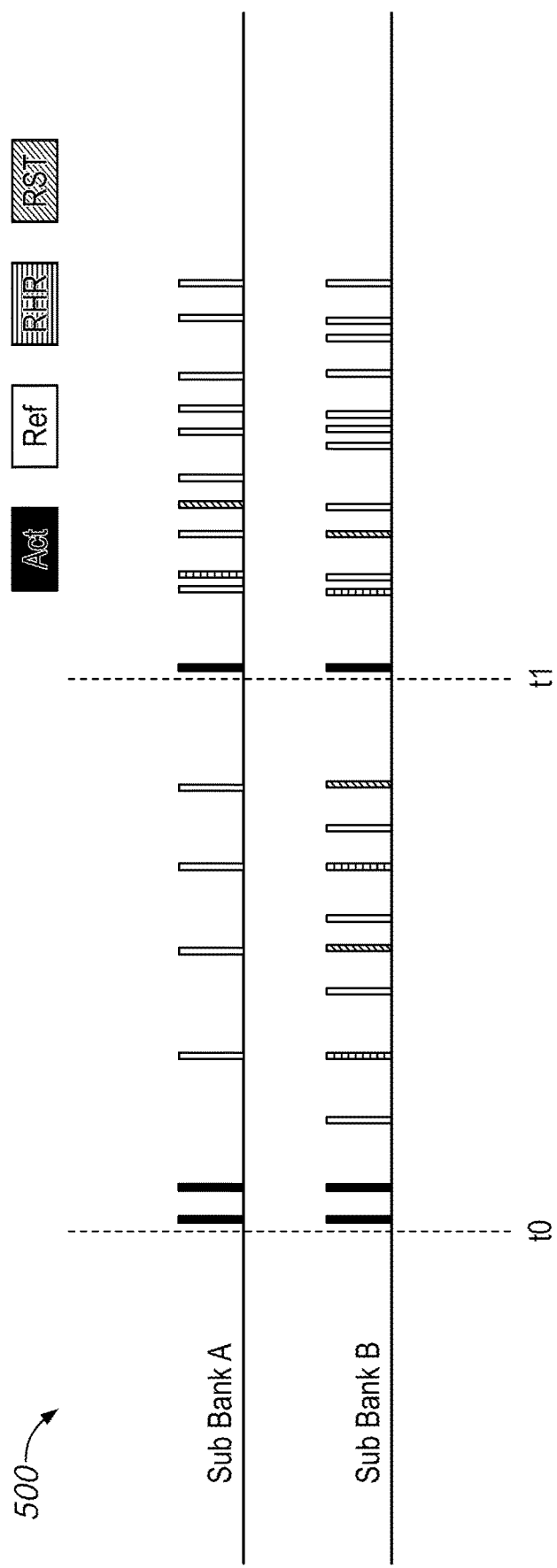
FIG. 5 is a timing diagram of refresh operations according to some embodiments of the present disclosure.

FIG. 5 is a timing diagram of refresh operations according to some embodiments of the present disclosure. The timing diagram 500 may, in some embodiments, represent the operations of refresh logic such as the refresh logic 400 of FIG. 4. The timing diagram 500 may be generally similar to the timing diagram 300 of FIG. 3. For the sake of brevity, features previously described with respect to FIG. 3 will not be described again.

At an initial time t0, a refresh period begins with two sequential refresh operations. Afterwards, an access is performed in sub-bank B, and the access address is identified as an aggressor. When a word line in sub-bank A is performed, a targeted refresh is performed on a victim associated with the aggressor. For the sake of simplicity, in the example of FIG. 5, only a single targeted refresh is performed per aggressor. During a next access in the sub-bank A, the aggressor is accessed so that its count value may be reset as part of a reset operation.

At a first time t1, an aggressor is detected in both sub-banks. During a first access to sub-bank A, a targeted refresh is performed in sub-bank B. Next during an access to sub-bank B a targeted refresh is performed in sub-bank A. Next, sub-bank A is accessed and the aggressor in sub-bank B is reset followed by an access to sub-bank B which allows a reset operation to be performed on the aggressor in sub-bank A.

Figure 6:
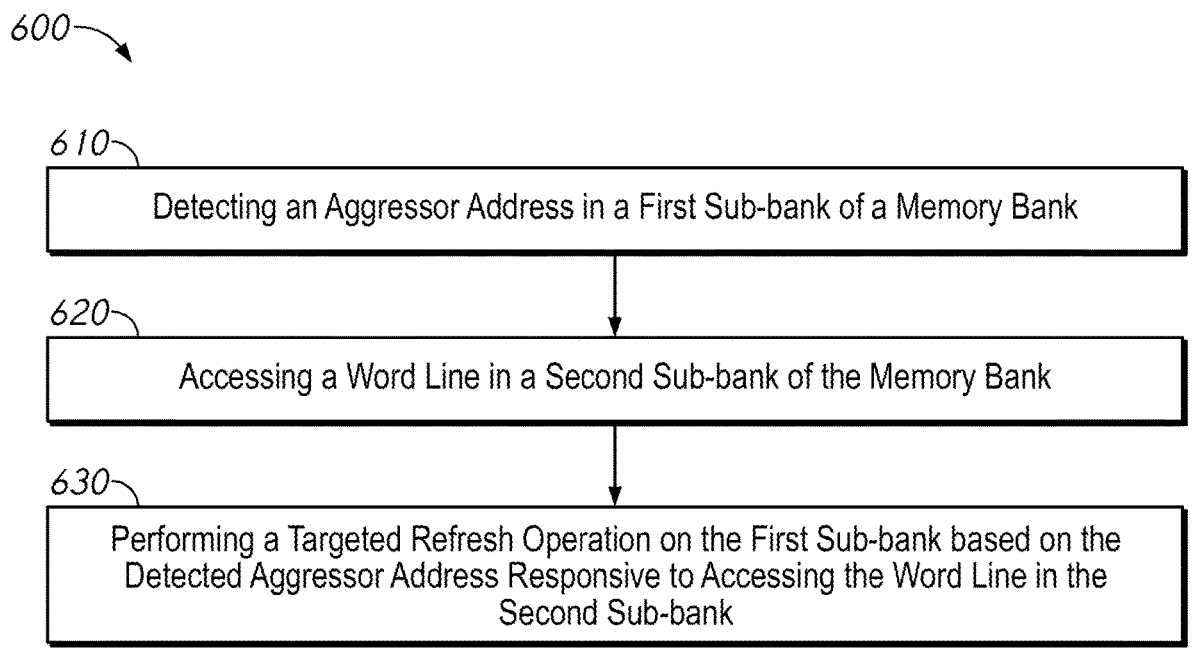
FIG. 6 is a flow chart of a method according to some embodiments of the present disclosure.

FIG. 6 is a flow chart of a method according to some embodiments of the present disclosure. The method 600 may, in some embodiments, be implemented by one or more of the apparatuses or components thereof described herein, such as the memory device 100 of FIG. 1, the refresh logic 200 of FIG. 2 and/or the refresh logic 400 of FIG. 4.

The method 600 includes block 610, which describes detecting an aggressor address in a first sub-bank of a memory bank. For example, the method 600 may include detecting the aggressor address with an aggressor detector 212 based on accesses to the aggressor address. For example, the method 600 may include counting accesses to accessed addresses and designating an address as the aggressor address when its count meets or exceeds a threshold. In some embodiments, the method 600 may include reading a count value from memory cells of a word line associated with the aggressor address and determining that it's the aggressor based on the count value.

The method 600 includes box 620, which describes accessing a word line in a second sub-bank of the memory bank. For example, an access address ACT-RA may be associated with a word line in the second sub-bank.

The method 600 includes box 630, which describes performing a targeted refresh operation on the first sub-bank based on the detected aggressor address responsive to accessing the word line in the second sub-bank. For example, the method 600 may include generating a refresh address based on the aggressor address and refreshing a word line associated with the refresh address as part of a targeted refresh operation. The method 600 may include performing the targeted refresh operation on the first sub-bank responsive to a next access operation in the second sub-bank after detecting the aggressor address in the first sub-bank. The method 600 may also include performing sequential refresh operations based on a refresh signal which periodically provided.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. A method comprising:
   detecting an aggressor address in a first sub-bank of a memory bank;
   accessing a word line in a second sub-bank of the memory bank; and
   performing a targeted refresh operation on the first sub-bank based on the detected aggressor address responsive to accessing the word line in the second sub-bank.

2. The method of claim 1, further comprising performing the targeted refresh operation on the first sub-bank responsive to a next access operation in the second sub-bank after detecting the aggressor address in the first sub-bank.

3. The method of claim 1, further comprising:
   detecting a second aggressor address in the second sub-bank;
   accessing a word line in the first sub-bank; and
   performing a targeted refresh operation on the second sub-bank based on the second aggressor address responsive to accessing the word line in the first sub-bank.

4. The method of claim 1, further comprising periodically performing sequential refresh operations on the first sub-bank.

5. The method of claim 1, further comprising detecting the aggressor address based on row addresses accessed in the first sub-bank.

6. The method of claim 1, further comprising:
   setting an aggressor detected flag responsive to detecting the aggressor address;
   comparing a row address associated with the accessed word line to the aggressor address when the flag is set; and
   providing a targeted refresh command to the first sub-bank when the row address and the aggressor address are not in the same sub-bank.

7. The method of claim 1, further comprising:
   detecting the aggressor address based on a count value stored along an aggressor word line associated with the aggressor address;
   accessing the word line or a different word line in the second sub-bank after performing the targeted refresh operation
   accessing the word line to reset the count value responsive to accessing the word line or the different word line.

8. An apparatus comprising:
   a first sub-bank of a memory bank;
   a second sub-bank of the memory bank; and
   a refresh control circuit configured to identify an aggressor address in the first sub-bank and perform a targeted refresh operation on the first sub-bank based on the aggressor address responsive an access operation on the second sub-bank.

9. The apparatus of claim 8, wherein the refresh control circuit comprises an aggressor detector circuit configured to provide a flag and the aggressor address responsive to detecting the aggressor address.

10. The apparatus of claim 9, wherein the refresh control circuit includes a comparator configured to compare the aggressor address to an accessed address when flag is set, wherein the refresh control circuit is configured to provide a targeted refresh signal responsive to the comparator determining the aggressor address and the accessed address are not in the same sub-bank.

11. The apparatus of claim 9, wherein the aggressor detector circuit is configured to identify the aggressor address based on a count value read from memory cells of the aggressor address.

12. The apparatus of claim 8, wherein the refresh control circuit includes a refresh address generator circuit configured to generate a refresh address based the aggressor address, wherein the targeted refresh operation is performed on a word line associated with the refresh address.

13. The apparatus of claim 12, wherein the refresh address generator circuit is further configured to generate a refresh address responsive to a refresh signal, wherein a sequential refresh operation is performed based on the refresh address and the refresh signal.

14. The apparatus of claim 8, wherein the refresh control circuit is further configured to identify a second aggressor address in the second sub-bank and perform a targeted refresh operation on the second sub-bank based on the second aggressor address responsive to an access operation on the first sub-bank.

* * * * *